US012604404B2

(12) United States Patent
Lane

(10) Patent No.: US 12,604,404 B2
(45) Date of Patent: Apr. 14, 2026

(54) CIRCUIT BOARD WELD STRUCTURE

(71) Applicant: Taicang Manaflex Technology Co., Ltd., Taicang (CN)

(72) Inventor: Robert C. Lane, Las Vegas, NV (US)

(73) Assignee: TAICANG MANAFLEX TECHNOLOGY CO., LTD. (CN)

( * ) Notice: Subject to any disclaimer, the term of this patent is extended or adjusted under 35 U.S.C. 154(b) by 160 days.

(21) Appl. No.: 18/484,616

(22) Filed: Oct. 11, 2023

(65) Prior Publication Data

US 2024/0130044 A1     Apr. 18, 2024

(30) Foreign Application Priority Data

Oct. 12, 2022     (CN) .......................... 202222690925.6

(51) Int. Cl.
| | |
|---|---|
| H05K 1/14 | (2006.01) |
| B23K 35/02 | (2006.01) |
| B23K 35/28 | (2006.01) |
| B23K 101/42 | (2006.01) |

(52) U.S. Cl.
CPC ......... H05K 1/144 (2013.01); B23K 35/0255 (2013.01); B23K 35/286 (2013.01); *B23K 2101/42* (2018.08); *H05K 2201/041* (2013.01)

(58) Field of Classification Search
CPC ... H05K 1/144; H05K 3/328; H05K 2201/041
See application file for complete search history.

(56) References Cited

U.S. PATENT DOCUMENTS

| | | | |
|---|---|---|---|
| 8,975,510 | B2 | 3/2015 | Coakley |
| 9,147,875 | B1 | 9/2015 | Coakley et al. |
| 9,466,777 | B2 | 10/2016 | Coakley et al. |
| 9,545,010 | B2 | 1/2017 | Coakley et al. |
| 9,832,857 | B2 | 11/2017 | Coakley et al. |
| 9,844,148 | B2 | 12/2017 | Coakley et al. |
| 10,153,570 | B2 | 12/2018 | Coakley et al. |
| 10,172,229 | B2 | 1/2019 | Coakley et al. |
| 10,211,443 | B2 | 2/2019 | Coakley et al. |

(Continued)

FOREIGN PATENT DOCUMENTS

| | | |
|---|---|---|
| CN | 118743316 A | 10/2024 |
| CN | 116897463 B | 11/2024 |

(Continued)

OTHER PUBLICATIONS

"Answer and Counterclaim" filed by Manaflex LLC, from U.S. District Court Northern District of California Oakland Division, Case No. 4:23-cv-04321-HSG, with parties *Cellink Corp.* v. *Manaflex LLC*, dated Nov. 15, 2023, 41 pages.

*Primary Examiner* — Nathan Milakovich
(74) *Attorney, Agent, or Firm* — Edell, Shapiro & Finnan, LLC

(57)     ABSTRACT

A circuit board weld structure comprises a first circuit board connected with and a second circuit board. A surface of the first circuit board is provided with a first covering film, the first covering film is provided with a first through hole, and a first welding pad is formed on the surface of the first circuit board. A surface of the second circuit board is provided with a second covering film, the second covering film is provided with a second through hole, and a second welding pad is formed on the surface of the second circuit board. The first welding pad is welded or coupled to the second welding pad through a filler piece.

20 Claims, 4 Drawing Sheets

(56) References Cited

U.S. PATENT DOCUMENTS

| 10,348,009 B2 | 7/2019 | Coakley et al. |
| 10,383,207 B2 | 8/2019 | Coakley |
| 10,446,956 B2 | 10/2019 | Coakley et al. |
| 10,542,616 B2 | 1/2020 | Coakley et al. |
| 10,694,618 B2 | 6/2020 | Coakley et al. |
| 10,874,015 B2 | 12/2020 | Coakley et al. |
| 10,964,931 B2 | 3/2021 | Coakley et al. |
| 11,108,175 B2 | 8/2021 | Coakley et al. |
| 11,116,070 B2 | 9/2021 | Coakley et al. |
| 11,206,730 B2 | 12/2021 | Coakley et al. |
| 11,516,904 B2 | 11/2022 | Coakley et al. |
| 11,532,902 B2 | 12/2022 | Coakley et al. |
| 11,545,773 B2 | 1/2023 | Coakley et al. |
| 11,751,328 B1 | 9/2023 | Ortiz et al. |
| 11,791,577 B2 | 10/2023 | Coakley et al. |
| 11,876,312 B2 | 1/2024 | Coakley et al. |
| 11,888,180 B2 | 1/2024 | Findlay et al. |
| 11,894,580 B2 | 2/2024 | Coakley et al. |
| 11,950,377 B1 | 4/2024 | Ortiz et al. |
| 11,979,976 B2 | 5/2024 | Coakley et al. |
| 12,010,792 B2 | 6/2024 | Ortiz et al. |
| 12,035,459 B2 | 7/2024 | Coakley et al. |
| 12,040,511 B2 | 7/2024 | Coakley et al. |
| 12,052,814 B2 | 7/2024 | Coakley et al. |
| 12,176,640 B2 | 12/2024 | Coakley et al. |
| 12,218,385 B2 | 2/2025 | Coakley et al. |
| 2022/0311103 A1 | 9/2022 | Findlay et al. |
| 2023/0101123 A1 | 3/2023 | Coakley et al. |
| 2024/0088585 A1 | 3/2024 | Coakley et al. |
| 2024/0215173 A1 | 6/2024 | Ortiz et al. |
| 2024/0222894 A1 | 7/2024 | Lane et al. |
| 2024/0276632 A1 | 8/2024 | Coakley et al. |
| 2024/0292527 A1 | 8/2024 | Ortiz et al. |
| 2024/0373546 A1 | 11/2024 | Coakley et al. |
| 2024/0388028 A1 | 11/2024 | Lane et al. |
| 2024/0421520 A1 | 12/2024 | Lane et al. |
| 2025/0024605 A1 | 1/2025 | Ortiz et al. |
| 2025/0038442 A1 | 1/2025 | Coakley et al. |
| 2025/0070490 A1 | 2/2025 | Coakley et al. |
| 2025/0070494 A1 | 2/2025 | Galligan et al. |
| 2025/0125506 A1 | 4/2025 | Lane et al. |

FOREIGN PATENT DOCUMENTS

| WO | 2017062886 A1 | 4/2017 |
| WO | 2018175599 A1 | 9/2018 |

CIRCUIT BOARD WELD STRUCTURE

RELATED APPLICATION

This application claims priority to and the benefit of Chinese Utility Model Application No. 202222690925.6, filed Oct. 12, 2022, entitled "Circuit Board Weld Structure," the disclosure of which is incorporated by reference herein in its entirety for all purposes.

FIELD OF THE INVENTION

The present invention relates to the electronic technical field, in particular to a circuit board weld structure.

BACKGROUND

Circuit boards include a variety of metal circuit boards, in the electronics industry, involving the connection of dissimilar metal circuit boards, but dissimilar metals (including but not limited to between aluminum and copper, stainless steel and copper) weldability is relatively poor, poor welding reliability. In addition, the surface of the circuit board is set with a covering film, resulting in a significant gap in the location where the two circuit boards need to be connected, direct welding will form virtual welding, false welding and other phenomena. Therefore, it is necessary to put forward improvements.

SUMMARY

The present invention relates to a circuit board weld structure that overcomes the shortcomings in the prior art. In order to realize the above purposes, the present invention provides several technical schemes.

In one embodiment of the invention, a circuit board weld structure comprises a surface of a first circuit board provided with a first covering film, the first covering film is provided with a first through hole, and a first welding pad is formed on the surface of the first circuit board. The circuit board weld structure also comprises a second circuit board, a surface of the second circuit board is provided with a second covering film, the second covering film is provided with a second through hole, and a second welding pad is formed on the surface of the second circuit board. The circuit board weld structure also comprises a filling piece, and two sides of the filling piece are respectively welded to the first welding pad and the second welding pad.

In one embodiment of the welding structure of the circuit board, a sum of a thickness of an aluminum sheet and a nickel plating layer is greater than a sum of a thickness of the first covering film and a second covering film.

In another embodiment of the welding structure of the circuit board, the cross sectional shape and size of the first pad, the second pad and the filling piece or sheet are the same.

In yet another embodiment of the welding structure of the circuit board, the first circuit board and the second circuit board are made of different metal materials.

In an alternative embodiment of the welding structure of the circuit board, the first circuit board is an aluminum circuit board, and the second limit board is a copper circuit board.

In one embodiment of the welding structure of the circuit board, the filler sheet comprises an aluminum sheet and a nickel plating layer arranged on the aluminum sheet, wherein the side of the aluminum sheet departing from the nickel plating layer is welded to the first welding pad, and the side of the nickel plating layer departing from the aluminum sheet is welded to the second welding pad. The terms "filler sheet", "filler piece", "filling sheet", "filling piece", and "filler plate" are used interchangeably herein.

In an alternative embodiment of the welding structure of the circuit board, the first circuit board is a stainless steel circuit board, and the second limit plate is a copper circuit board.

In yet another embodiment of the welded structure of the circuit board, the filler sheet is made of stainless steel.

In one implementation, a circuit board weld structure comprises a first circuit board having at least one surface, the at least one surface of the first circuit board being provided with a first covering film, the first covering film having a first through hole formed therein, and a first welding pad is formed on the surface of the first circuit board, a second circuit board having at least one surface, the at least one surface of the second circuit board being provided with a second covering film, the second covering film having a second through hole formed therein, and a second welding pad is formed on the surface of the second circuit board, and a filling piece having a first side and a second side opposite to the first side, the first side of the filling piece is welded to the first welding pad, and the second side of the filling piece is welded to the second welding pad.

In one embodiment, the filling piece includes an aluminum sheet and a nickel plating layer, the aluminum sheet has a thickness, and the nickel plating layer has its own thickness. In another embodiment, the first covering film has a first thickness, the second covering film has a second thickness, and a sum of the thickness of the aluminum sheet and the thickness of the nickel plating layer is greater than a sum of the first thickness and the second thickness. In yet another embodiment, at least one of a cross-sectional shape and a size of each of the first welding pad, the second welding pad, and the filling piece are the same.

In one embodiment, the first circuit board and the second circuit board are made of different metal materials. In one alternative, the first circuit board is made of aluminum, and the second circuit board is made of copper. The filling piece includes an aluminum sheet and a nickel plating layer coupled to the aluminum sheet, the aluminum sheet is welded to the first welding pad, and the nickel plating layer is welded to the second welding pad. In another alternative, the first circuit board is made of stainless steel, and the second circuit board is made of copper. The filling piece is made of stainless steel.

In another implementation, a circuit board weld structure comprises a first circuit board, the first circuit board having a first surface to which a first film is coupled, the first surface also having a first welding pad coupled thereto, the first film defining a first through hole therein, a second circuit board, the second circuit board having a second surface to which a second film is coupled, the second surface also having a second welding pad coupled thereto, the second film defining a second through hole therein, and a filler piece having a first side and a second side opposite to the first side, the first side of the filler piece is welded to the first welding pad, and the second side of the filler piece is welded to the second welding pad.

In one embodiment, the filler piece includes an aluminum sheet and a nickel plating layer coupled to the aluminum sheet, and the coupled aluminum sheet and the nickel plating layer have a thickness. In an alternative embodiment, the first film has a first thickness, the second film has a second thickness, and the thickness of the coupled aluminum sheet and nickel plating layer is greater than a sum of the first thickness and the second thickness. Each of the first welding pad, the second welding pad, and the filler piece has its own cross-sectional shape and its own size, and at least one of the cross-sectional shape or the size of each of the first welding pad, the second side welding pad, and the filler piece are the same.

In another embodiment, the first circuit board and the second circuit board are both metal, and are both made of different materials. In one alternative, the first circuit board is made of aluminum, and the second circuit board is made of copper. In another alternative, the filler piece includes an aluminum sheet and a nickel plating layer coupled to the aluminum sheet, the aluminum sheet is welded to the first welding pad, and the nickel plating layer is welded to the second welding pad. In yet another embodiment, the first circuit board is made of stainless steel, the second circuit board is made of copper, and the filler piece is made of stainless steel.

In an alternative implementation, a circuit board weld structure comprises a first circuit board made of a first metal, the first circuit board having a first surface to which a first covering film is coupled, the first surface also having a first welding pad coupled thereto, the first covering film defining a first through hole therein, a second circuit board made of a second metal, the second metal being different than the first metal, the second circuit board having a second surface to which a second covering film is coupled, the second surface also having a second welding pad coupled thereto, the second covering film defining a second through hole therein, and a filler piece having a first side and a second side opposite to the first side, the first side of the filler piece is welded to the first welding pad, and the second side of the filler piece is welded to the second welding pad.

In one embodiment, the filler piece includes an aluminum sheet and a nickel plating layer coupled to the aluminum sheet, the coupled aluminum sheet and the nickel plating layer have a thickness, the first covering film has a first thickness, the second covering film has a second thickness, and the thickness of the coupled aluminum sheet and nickel plating layer is greater than a sum of the first thickness and the second thickness. In another embodiment, the first circuit board is made of aluminum, the second circuit board is made of copper, the filler piece includes an aluminum sheet and a nickel plating layer coupled to the aluminum sheet, the aluminum sheet is welded to the first welding pad, and the nickel plating layer is welded to the second welding pad.

The various embodiments of the circuit board welding structure disclosed herein have the advantages of a simple structure, avoiding direct welding of dissimilar metals through the filling piece or sheet arranged between the first welding pad and the second welding pad, and at the same time, filling the gap between the first welding pad and the second welding pad, improving the stability of welding.

DETAILED DESCRIPTION

The following is a detailed description of the technical scheme and aspects of different implementations of a welding structure of a circuit board. It is to be understood that the described implementations are only exemplary implementations, and that additional implementations are contemplated. Based on the implementations disclosed herein, all other implementations obtained by ordinary technical personnel in the field under the premise of not making creative labor belong to the scope of protection herein.

Like numbers refer to like elements throughout. The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

In the description herein, any orientation or position relationship indicated by the spatially relative terms "center", "up", "down", "left", "right", "vertical", "horizontal", "inside", "outside", etc. is based on an orientation or position relationship shown in a drawing, only for the purpose of facilitating and simplifying the description. Rather than indicating or implying that the device or element referred to must have a specific orientation, structure, and operation in a specific orientation, the spatially relative terms are intended to encompass different orientations of a device or element in use or operation in addition to the orientation illustrated in the figures. In addition, the terms "first", "second" and "third" are used only for descriptive purposes and should not be interpreted as indicating or suggesting relative importance.

In the description herein, it should be understood that, unless otherwise expressly specified and limited, the term "connection" shall be broadly understood, for example, to be a fixed connection or a detachable connection. In addition, the term "connection" includes a mechanical connection or an electrical connection. Also, such a "connection" can be directly connected, indirectly connected through an intermediate medium, or a connection within the two components. For ordinary technical personnel in the field, the specific meanings of the above term will be understood in specific circumstances.

Figure 1:
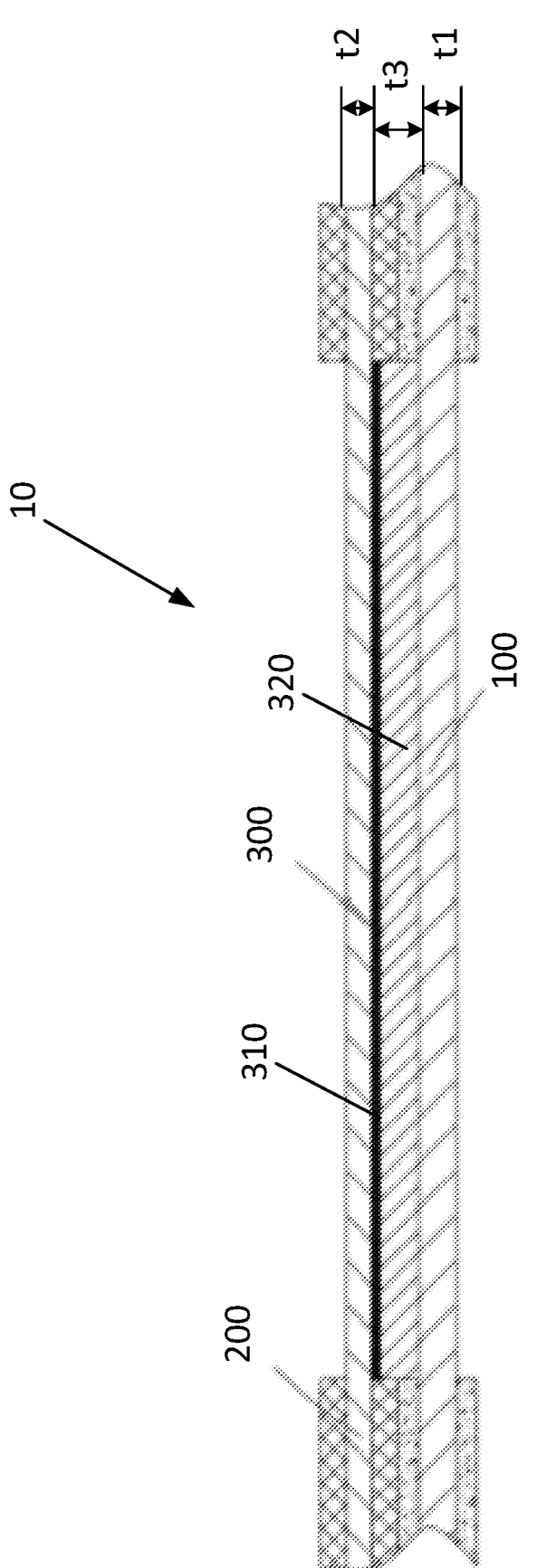
FIG. 1 is a cross-sectional view of a first embodiment of a welding structure of a circuit board according to an aspect of the invention.
Figure 2:
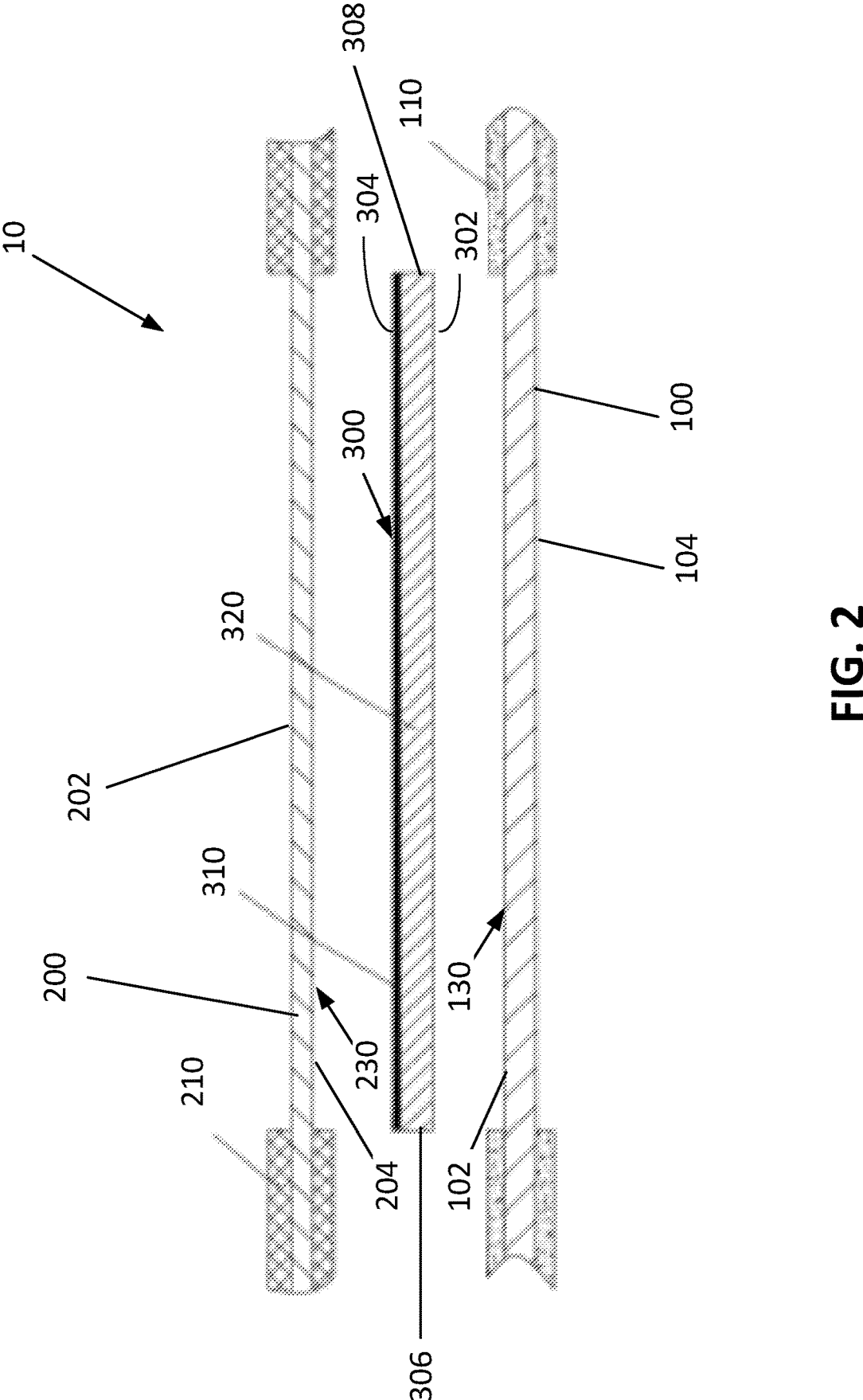
FIG. 2 is an exploded cross-sectional view of the welding structure of the circuit board illustrated in FIG. 1.

A first implementation of a circuit board weld structure is illustrated in FIGS. 1 and 2. In FIG. 1, a cross-sectional view of a portion of the circuit board weld structure 10 is illustrated, and in FIG. 2, an exploded cross-sectional view of the portion of the circuit board weld structure 10 is illustrated. The circuit board weld structure 10 comprises a first circuit board 100, which in this embodiment, is made of aluminum. The first circuit board 100 includes opposite surfaces 102 and 104 (see FIG. 2) of the first circuit board 100 that are provided with a first covering film 110. The first covering film 110 is provided with a first pass hole or through hole, and the first welding pad 130 is formed on surface 102 of the first circuit board 100.

The circuit board weld structure 10 includes a second circuit board 200. In this embodiment, the second circuit board 200 is made of copper. The second circuit board 200 includes opposite surfaces 202 and 204. The surfaces 202 and 204 of the second circuit board 200 are provided with a second covering film 210. The second covering film 210 is provided with a second pass hole or through hole, and a second welding pad 230 is formed on surface 204 of the second circuit board 200.

In the embodiment illustrated in FIGS. 1 and 2, a filler piece 300 is included in the circuit board weld structure 10. As shown in FIG. 2, the filler piece 300 includes a first side 302 and an opposite second side 304. The two sides 302 and 304 of filler piece 300 are welded to the first welding pad 130 and the second welding pad 230, respectively.

In one implementation, the first covering film 110 and the second covering film 210 are Polyimide (PI) film, which is a lightweight, flexible polymer based material. The first covering film 110 and the second covering film 210 are used to protect the line from being oxidized or damaged. The pads utilize the PI film to improve the overall strength, and the first cover film and the second cover film are opened in the first through hole and the second through hole, respectively, thereby exposing the corresponding aluminum foil and copper foil from the first pad and the second pad. When welding, the two ends 306 and 308 of the filling piece or sheet 300 are embedded in the first through hole and the second through hole, and contact with the corresponding first pad 130 and the second pad 230, and then the welding is completed. This structure has the advantages being simple, avoiding the direct welding of aluminum foil of the first line road plate and copper foil of the second circuit board through the filling piece or sheet arranged between the first welding pad 130 and the second welding pad 230, and filling the gap between the first welding pad 130 and the second welding pad 230 at the same time to improve the stability of welding.

By example, as shown in FIG. 1, the sum of thickness of aluminum sheet 310 and nickel-plated layer 320 is shown by the dimension "t3". In addition, the thickness of the first covering film 110 is shown by the dimension "t1", and the thickness of the second covering film 210 is shown by the dimension "t2". In this implementation, the thickness "t3" is greater than the sum of thickness "t1" of the first covering film 110 and the thickness "t2" of the second covering film 210.

In the technical solution, after the first circuit board 100 and the second circuit board 200 are stacked, there is a gap between the first pad 130 and the second pad 230. The thickness "t3" of the filler sheet 300 should ensure that its two ends 306 and 308 are in full contact with the corresponding first pad 130 and the second pad 230, respectively, so as to avoid situations such as virtual welding and false welding, and to improve the stability of welding. The filler sheet 300 can also play a positioning role. The filler sheet 300 ensures the coaxial degree of the first pad 130 and the second pad 230, reduces the difficulty of positioning, reduces the need for any external alignment or fixed tightening and other tooling, and is easy to operate.

In one process, a user can take 0.1 mm thick copper foil made of the second circuit board 200 with its two surfaces 202 and 204 covered with 0.1 mm thick of the second covering film 210, and place it proximate to a 0.15 mm thick aluminum foil made of the first line plate 100, one or more of its surfaces 102 and 104 being covered with 0.08 mm thick of the first covering film 110. When the second circuit board 200 and the first line 100 are stacked, there is a gap of 0.18 mm between the first pad 130 and the second pad 230. It is desirable to fill the corresponding gap with a filler sheet 300 that has a thickness "t3" larger than 0.18 mm to improve the stability of welding.

Figure 2A:
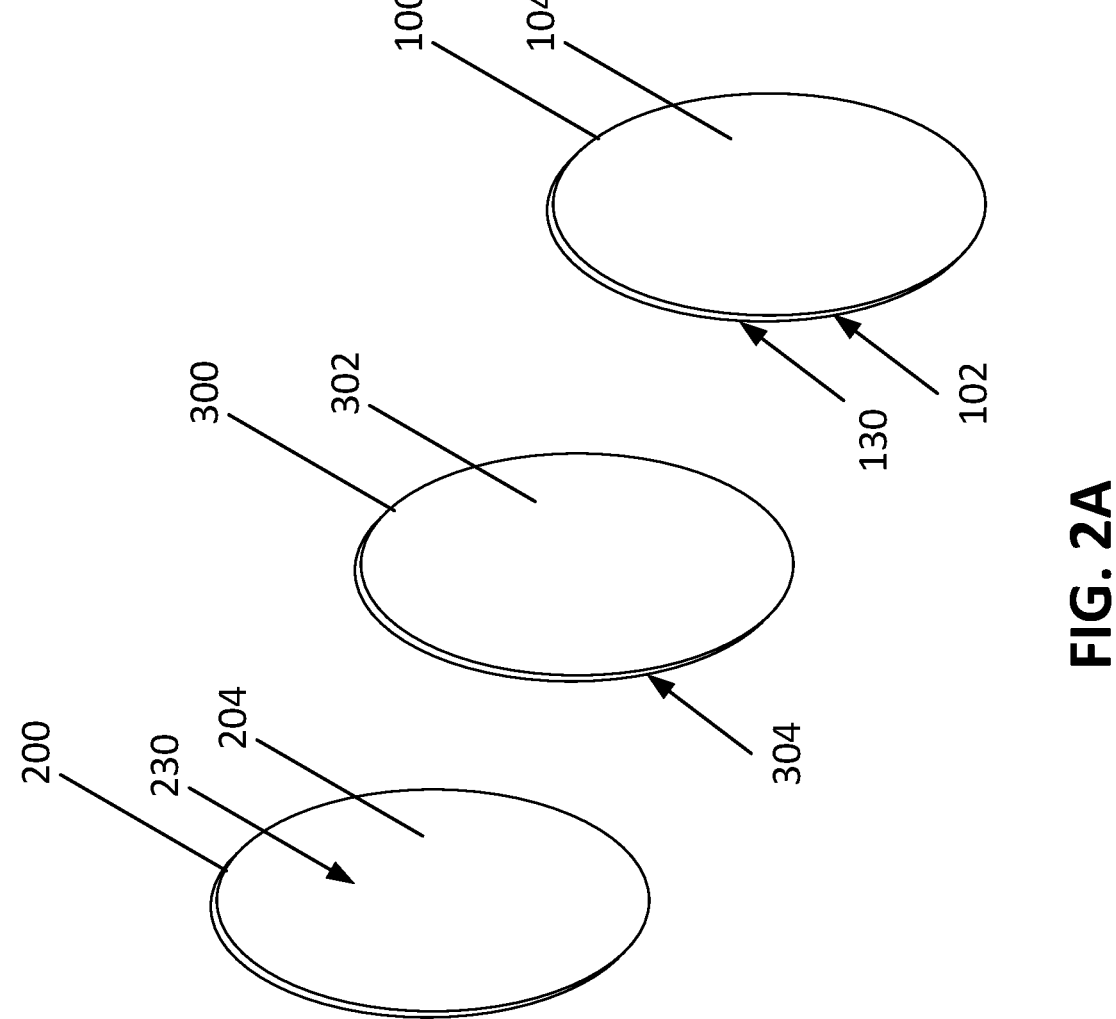
FIG. 2A is an exploded view showing the welding pads and the filler piece of the circuit board illustrated in FIG. 1.

By example, as shown in FIGS. 1 and 2A, the first pad 130, the second pad 230, and the filler piece 300 have the same cross-sectional shape and size. In the technical scheme, the shape of each of the first pad 130, the second pad 230, and the filler piece 300 can be round, diamond shaped, or be another common structure. In one implementation, the single-sided nickel-plated aluminum sheet is made into the filling piece or sheet 300 corresponding to the first pad 130 and the second pad 230 by laser cutting, which is convenient for mass production and reduces the production cost.

As shown in FIGS. 1 and 2, the filler sheet 300 comprises an aluminum sheet 310 and a nickel plating layer 320 arranged on a single side of the aluminum sheet 310. The side of the aluminum sheet 310 away from the nickel plating layer 320 is welded to the first welding pad 130, and the side of the nickel plating layer 320 away from the aluminum sheet 310 is welded to the second welding pad 230.

In the welding process, initially, one of the ends of the filler sheet 300 with nickel plating layer 320 is inserted into the second through hole, the nickel plating layer 320 contacts the copper foil 200 at the second pad 230, and connects the nickel plating layer 320 with the second pad 230 by tin welding. Then, the first through hole of the first line plate 100 is set on the aluminum sheet 310 of the filler sheet 300, the aluminum sheet 310 contacts the aluminum foil at the first pad 130, and is fixed by laser welding. By avoiding the direct welding of the aluminum foil of the first line plate 100 and the copper foil of the second circuit board 200, the stability of welding is improved.

Figure 3:
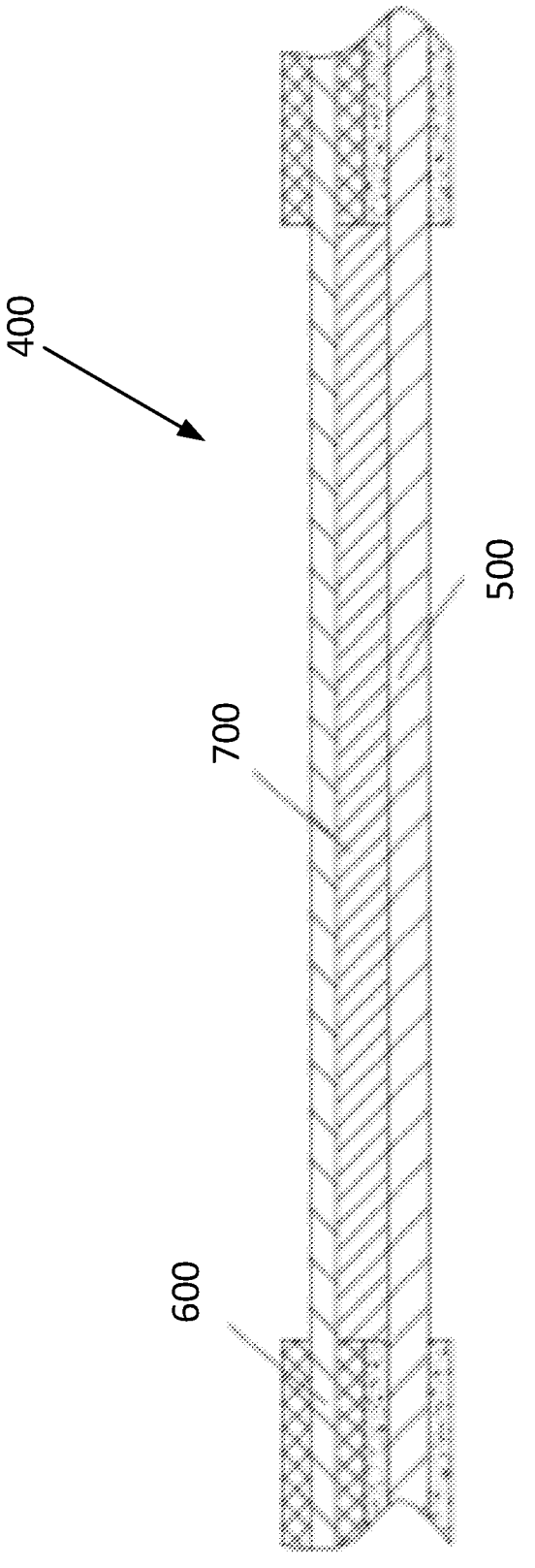
FIG. 3 is a cross-sectional view of a second embodiment of a welding structure of a circuit board according to another aspect of the invention.

Referring to FIG. 3, an alternative embodiment of a circuit board weld structure is illustrated. In FIG. 3, this circuit board weld structure 400 includes a first circuit board 500 that is a stainless steel circuit board, a second circuit board 600 that is a copper circuit board, and a filler piece 700 is directly cut from a stainless steel plate. The stainless steel plate can be directly tinned with the copper foil without adding a coating.

In summary, the circuit board weld structures disclosed herein have the advantages of being simple structures, through a filling of filler piece or sheet arranged between a first welding plate and a second welding plate, transferred to the different metals of the second circuit board of the first line plate, but the reliability of welding is significantly improved. At the same time, a filling piece or sheet is filled in the gap between the first welding plate and the second welding plate, so that the corresponding welding surface is completely fitted and the stability of welding is improved.

It should be noted that, the terms "includes", "contains" or any other variation thereof is intended to cover non-exclusive inclusion so that a process, method, article or device comprising a series of elements includes not only those elements, but also other elements not expressly listed, as well as elements inherent to such a process, method, article or equipment. Without any further limitation, the statement "includes a . . . " does not preclude the existence of another identical element in the process, method, article or apparatus in which the element is included.

The above description relates to two specific implementations of a circuit board weld structure, and it should be pointed out that for ordinary technical personnel in the technical field, under the premise of not being separated from the principles herein, a number of improvements and refinements can be made, and these improvements and refinements should also be regarded as the scope of protection of herein.

It will also be understood that, as used herein, the terms "example," "exemplary," and derivatives thereof are intended to refer to non-limiting examples and/or variants embodiments discussed herein, and are not intended to indicate preference for one or more embodiments discussed herein compared to one or more other embodiments.

The invention claimed is:

1. A circuit board weld structure, comprising:
a first circuit board having at least one surface, the at least one surface of the first circuit board being provided with a first covering film, the first covering film having a first through hole formed therein, and a first welding pad is formed on the surface of the first circuit board;
a second circuit board having at least one surface, the at least one surface of the second circuit board being provided with a second covering film, the second covering film having a second through hole formed therein, and a second welding pad is formed on the surface of the second circuit board; and
a filling piece having a first side and a second side opposite to the first side, the first side of the filling piece is welded to the first welding pad, and the second side of the filling piece is welded to the second welding pad.

2. The circuit board weld structure of claim 1, wherein the filling piece includes an aluminum sheet and a nickel plating layer, the aluminum sheet has a thickness, and the nickel plating layer has its own thickness.

3. The circuit board weld structure of claim 2, wherein the first covering film has a first thickness, the second covering film has a second thickness, and a sum of the thickness of the aluminum sheet and the thickness of the nickel plating layer is greater than a sum of the first thickness and the second thickness.

4. The circuit board weld structure of claim 1, wherein at least one of a cross-sectional shape and a size of each of the first welding pad, the second welding pad, and the filling piece are the same.

5. The circuit board weld structure of claim 1, wherein the first circuit board and the second circuit board are made of different metal materials.

6. The circuit board weld structure of claim 5, wherein the first circuit board is made of aluminum, and the second circuit board is made of copper.

7. The circuit board weld structure of claim 6, wherein the filling piece includes an aluminum sheet and a nickel plating layer coupled to the aluminum sheet, the aluminum sheet is welded to the first welding pad, and the nickel plating layer is welded to the second welding pad.

8. The circuit board weld structure of claim 5, wherein the first circuit board is made of stainless steel, and the second circuit board is made of copper.

9. The circuit board weld structure of claim 8, wherein the filling piece is made of stainless steel.

10. A circuit board weld structure, comprising:
a first circuit board, the first circuit board having a first surface to which a first film is coupled, the first surface also having a first welding pad coupled thereto, the first film defining a first through hole therein;
a second circuit board, the second circuit board having a second surface to which a second film is coupled, the second surface also having a second welding pad coupled thereto, the second film defining a second through hole therein; and
a filler piece having a first side and a second side opposite to the first side, the first side of the filler piece is welded to the first welding pad, and the second side of the filler piece is welded to the second welding pad.

11. The circuit board weld structure of claim 10, wherein the filler piece includes an aluminum sheet and a nickel plating layer coupled to the aluminum sheet, and the coupled aluminum sheet and the nickel plating layer have a thickness.

12. The circuit board weld structure of claim 11, wherein the first film has a first thickness, the second film has a second thickness, and the thickness of the coupled aluminum sheet and nickel plating layer is greater than a sum of the first thickness and the second thickness.

13. The circuit board weld structure of claim 10, wherein each of the first welding pad, the second welding pad, and the filler piece its own cross-sectional shape and its own size, and at least one of the cross-sectional shape or the size of each of the first welding pad, the second side welding pad, and the filler piece are the same.

14. The circuit board weld structure of claim 10, wherein the first circuit board and the second circuit board are both metal, and are both made of different materials.

15. The circuit board weld structure of claim 14, wherein the first circuit board is made of aluminum, and the second circuit board is made of copper.

16. The circuit board weld structure of claim 15, wherein the filler piece includes an aluminum sheet and a nickel plating layer coupled to the aluminum sheet, the aluminum sheet is welded to the first welding pad, and the nickel plating layer is welded to the second welding pad.

17. The circuit board weld structure of claim 14, wherein the first circuit board is made of stainless steel, the second circuit board is made of copper, and the filler piece is made of stainless steel.

18. A circuit board weld structure, comprising:
a first circuit board made of a first metal, the first circuit board having a first surface to which a first covering film is coupled, the first surface also having a first welding pad coupled thereto, the first covering film defining a first through hole therein;
a second circuit board made of a second metal, the second metal being different than the first metal, the second circuit board having a second surface to which a second covering film is coupled, the second surface also having a second welding pad coupled thereto, the second covering film defining a second through hole therein; and
a filler piece having a first side and a second side opposite to the first side, the first side of the filler piece is welded to the first welding pad, and the second side of the filler piece is welded to the second welding pad.

19. The circuit board weld structure of claim 18, wherein the filler piece includes an aluminum sheet and a nickel plating layer coupled to the aluminum sheet, the coupled aluminum sheet and the nickel plating layer have a thickness, the first film has a first thickness, the second film has a second thickness, and the thickness of the coupled aluminum sheet and nickel plating layer is greater than a sum of the first thickness and the second thickness.

20. The circuit board weld structure of claim 18, wherein the first circuit board is made of aluminum, the second circuit board is made of copper, the filler piece includes an aluminum sheet and a nickel plating layer coupled to the aluminum sheet, the aluminum sheet is welded to the first welding pad, and the nickel plating layer is welded to the second welding pad.

* * * * *